United States Patent [19]

Tults et al.

[11] 4,426,734

[45] Jan. 17, 1984

[54] ARRANGEMENT USEFUL IN A PHASE LOCKED LOOP TUNING CONTROL SYSTEM FOR SELECTIVELY APPLYING AN AFT VOLTAGE IN A MANNER TO IMPROVE LOOP STABILITY

[75] Inventors: Juri Tults, Indianapolis, Ind.; Charles M. Wine, Princeton, N.J.

[73] Assignee: RCA Corporation, New York, N.Y.

[21] Appl. No.: 352,885

[22] Filed: Feb. 26, 1982

[51] Int. Cl.³ ............................................. H04B 1/26
[52] U.S. Cl. ................................. 455/180; 455/182; 455/183
[58] Field of Search ............... 455/182, 183, 192, 195, 455/180; 358/193.1

[56] References Cited

U.S. PATENT DOCUMENTS

| | | |
|---|---|---|
| 2,872,579 | 2/1959 | Kihn . |
| 3,631,347 | 12/1971 | Chipman . |
| 3,814,843 | 6/1974 | Kruszewski . |
| 4,031,549 | 6/1977 | Rast . |
| 4,122,493 | 10/1978 | Arumugham et al. . |
| 4,125,863 | 11/1978 | Arumugham . |
| 4,142,157 | 2/1979 | Tanaka . |
| 4,156,199 | 5/1979 | Hendrickson et al. ............. 455/195 |
| 4,184,121 | 1/1980 | Tanaka ................................ 455/183 |
| 4,245,351 | 1/1981 | Tults . |

OTHER PUBLICATIONS

"DIGITALES PROGRAMMSPEICHER-SYSTEM" by Friedrich Timmermann, Funkschau 1977, Heft 17, (with partial translation).

Primary Examiner—Jin F. Ng
Attorney, Agent, or Firm—E. M. Whitacre; P. J. Rasmussen; P. M. Emanuel

[57] ABSTRACT

In a phase locked loop tuning system including a phase comparator for producing a pulse type error signal representing the phase and frequency deviation between a frequency divided version of the local oscillator signal and a reference frequency signal and a mode switch for coupling the error signal to an integrator for developing a tuning voltage when a channel is initially selected and thereafter for coupling an AFT voltage to the integrator to modity the tuning voltage to correct for a frequency deviation of the IF signal, switching duty cycle control apparatus is provided for controlling the duty cycle at which the AFT voltage is coupled to the integrator in accordance with the selected channel and more particularly with its band to make the AFT response more consistent throughout the tuning range.

10 Claims, 8 Drawing Figures

ARRANGEMENT USEFUL IN A PHASE LOCKED LOOP TUNING CONTROL SYSTEM FOR SELECTIVELY APPLYING AN AFT VOLTAGE IN A MANNER TO IMPROVE LOOP STABILITY

The present invention concerns tuning control systems for a voltage controlled tuner in which an automatic fine tuning (AFT) voltage is selectively applied to a local oscillator to correct for frequency deviations of the intermediate frequency (IF) signal produced by the tuner and particularly to an arrangement for making the response of the tuning system to the AFT voltage more uniform throughout the tuning range.

Voltage controlled tuners employed in many commercially available television and radio receivers includes diodes, commonly referred to as "varactor diodes", which are reverse biased by a tuning control voltage to exhibit a capacitance reactance. The value of the capacitance reactance is directly related to the magnitude of the tuning control voltage. The varacter diodes are connected with inductors in tuned circuits used to select the radio frequency (RF) signal and to determine the frequency of the local oscillator (LO) signal which are heterodyned to produce an IF signal in accordance with a desired channel. For parallel connected tuned circuits, the magnitude of the tuning voltage increases as the frequency of the desired RF carrier increases.

The IF signal produced by the tuner includes at least one information bearing carrier, e.g., a picture carrier in a television receiver, which has a nominal frequency, e.g., 45.75 MHz in the United States, when the tuner has correctly tuned the receiver for the desired channel. The frequency of the information bearing carrier may not be at its nominal value for a variety of reasons. For example, components in the tuner may change in value due to age and operating environment, or is sometimes the case in cable distribution systems, the RF carriers received by the tuner may not have correct or standard frequencies. For that reason, television receivers typically include an automatic fine tuning (AFT) circuit including a frequency discriminator tuned to the nominal frequency of the picture carrier for deriving an AFT voltage which by its magnitude and polarity represents the magnitude and sense of the frequency deviation of the IF picture carrier. The AFT voltage is applied to tuner in a sense to minimize the frequency deviation of the IF picture carrier.

In a television receiver the tuning range is very large. For example, in the United States, the television RF signals are in a range extending approximately from 54 MHz to 900 MHz. Since a single tuned circuit including a varactor diode and a fixed inductor configuration is incapable of being tuned over such a large range, the tuner is partitioned into tuning sections for tuning the receiver to channels in respective bands within the range. Most conventionally, there is a VHF tuning section and a UHF tuning section. Since the bands themselves are large, the inductor configurations within the tuning sections may be switched for tuning the receiver to channels in respective sub-bands within the bands.

While the ranges of the magnitude of the tuning voltage for the bands and sub-bands are all approximately the same, the number of channels in the bands and sub-bands may vary considerably. Because of the popularity of cable systems which provide many channels which are not broadcast, television receiver manufacturers have begun to provide tuners capable of tuning cable channels as well as broadcast channels. The difference in the number of channels in the various bands and sub-bands in such cable compatable tuners is considerably greater than that in tuners for tuning only broadcast channels. The difference in the number of channels means that the slope of the tuning voltage characteristic, i.e., the magnitude of the tuning voltage versus frequency (or channel) characteristic, may vary considerably between the various bands and sub-bands. The slope of a tuning voltage characteristic is a measure of the sensitivity of the tuning system to the AFT voltage. That is, the slope of the tuning voltage characteristic determines how much of a change of AFT voltage is needed to correct a given frequency error. Viewed another way, the slope of a tuning voltage characteristic is a measure of the gain of the AFT control loop. As a result of the considerably different AFT control loop gains in the various bands and sub-bands, it is difficult to ensure the stability of the AFT control loop over the relatively large tuning voltage range.

The present invention is concerned with apparatus for making the AFT loop gain more uniform throughout the television tuning range in the type of tuning control system in which a switching arrangement selectively applies an AFT voltage to the tuner in response to a switching control signal. The apparatus includes means for controlling the duty cycle of the switching control signal as a function of the channel selected to compensate for different AFT sensitivities.

In a preferred embodiment of the present invention, the tuning control system comprises a phase locked loop for generating a tuning voltage for a voltage controlled local oscillator by establishing a proportional relationship between a reference frequency signal and the local oscillator signal in accordance with the selected channel. A switching arrangement selectively applies an AFT voltage to the local oscillator to correct for deviation between the frequency of information bearing carrier of the IF signal produced by the tuner and its nominal value. Apparatus is provided for generating a pulse signal having its duty cycle controlled in accordance with the selected channel. The pulse signal controls the duty cycle of the switching arrangement and thereby the duty cycle of the AFT voltage applied to the local oscillator to compensate for different AFT sensitivities.

The present invention will be described in detail with reference to the accompanying Drawing in which.

Figure 1:
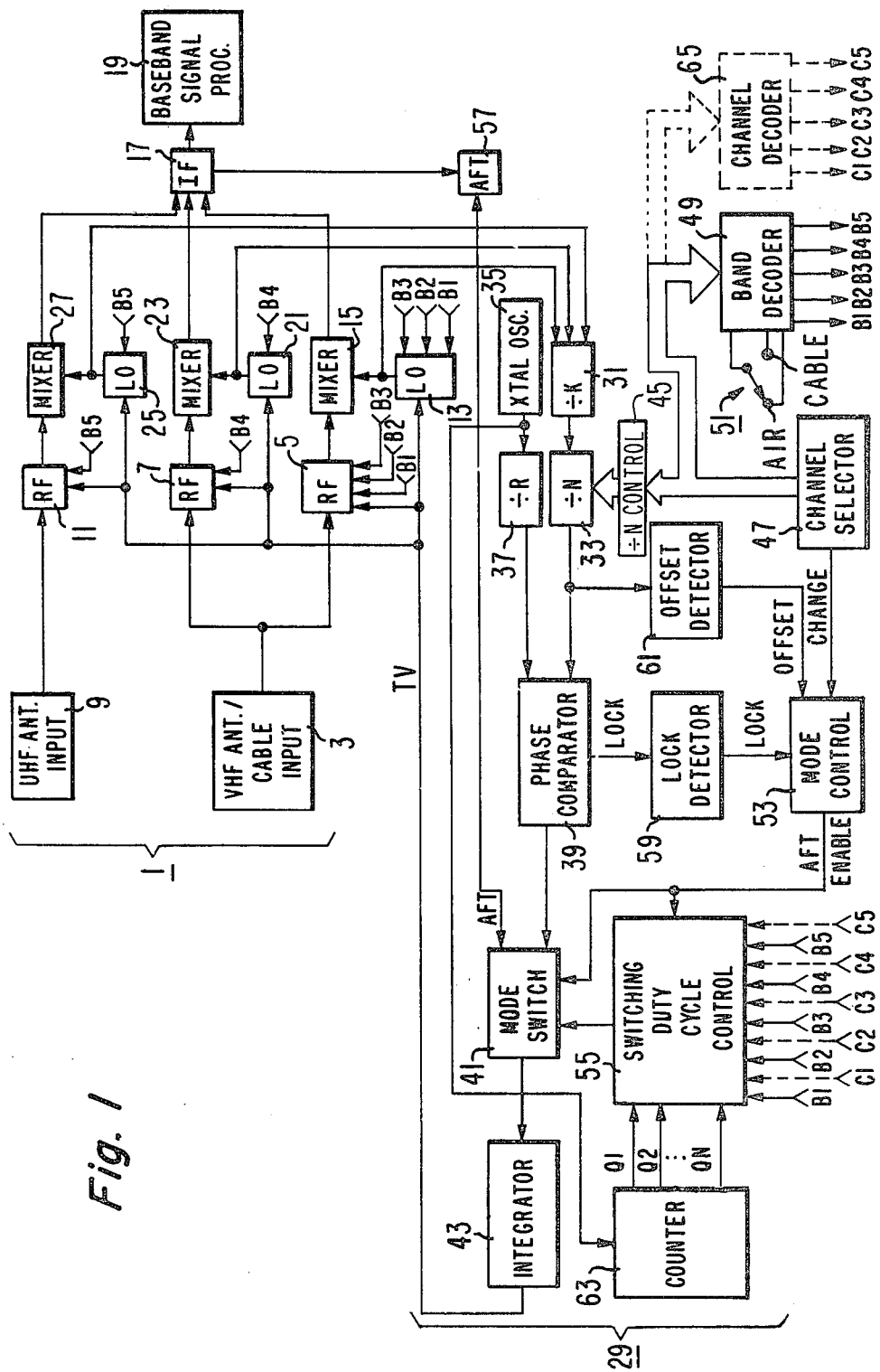
FIG. 1 is a block diagram of a tuning system of a television receiver employing the preferred embodiment of the present invention.

The tuning system of the television system shown in FIG. 1 has the capability of tuning cable as well as broadcast channels. For this purpose the tuner, generally indicated as 1, is arranged to tune channels in five bands within the television tuning range. By way of example, for the frequency allocations employed in the United States, the channels contained within each band and the corresponding RF and local oscillator frequency ranges are indicated in the following table.

TABLE 1

| BAND | CHANNEL | RF FREQUENCY RANGE (MHZ) | LO FREQUENCY RANGE (MHZ) |
|---|---|---|---|
| 1 | low VHF broadcast 2-6 | 54-88 | 101-129 |
| 2 | low midband cable A-5-A-1 | 90-120 | 137-161 |
| 3 | high midband cable A-I and high VHF broadcast 7-13 | 120-216 | 167-257 |
| 4 | superband cable J-W and hyperband cable W+1-W+17 | 216-402 | 263-443 |
| 5 | UHF broadcast 14-83 | 470-890 | 517-931 |

Tuner 1, includes a VHF antenna/cable input 3 for providing VHF broadcast or cable RF signals to a first RF stage 5 and a second RF stage 7 and a UHF antenna input for providing UHF broadcast RF signals to a third RF section 11.

First RF stage 5 and a first local oscillator 13 are rendered operative in response to any one of three band selection signals B1, B2 and B3 generated, as will be described below, when a channel in a respective one of band 1, 2 or 3 is selected. When rendered operative, first RF stage 5 is tuned to select the RF signal corresponding to the selected channel and first local oscillator 13 generates a first local oscillator at a frequency also corresponding to the selected channel in accordance with the magnitude of a tuning voltage (TV). A first mixer 15 heterodynes the selected RF signal and the first local oscillator signal to produce an IF signal. As will be explained below, the magnitude of the tuning voltage is controlled so that the frequency of the picture carrier of the IF signal has a nominal value, e.g., 45.75 MHz in the United States. The IF signal is filtered by an IF section 17. A baseband signal processing unit 19 derives video, color and sound representative signals from the filtered IF signal.

Second RF section 7, a second local oscillator 21 and a second mixer 23 operate in similar fashion to first RF sections 5, first local oscillator 13 and mixer 15 to produce an IF signal when rendered operative in response to a band selection signal B4 generated when a channel in band 4 is selected. In like manner, RF section 11, a third local oscillator 25 and a third mixer 27 produce an IF signal when rendered operative in response to a band selection signal B5 generated when a channel in band 5 is selected.

Each of the RF stages and local oscillators includes a respective tuned circuit comprising the parallel combination of a varactor diode and an inductor. The varactor diodes are reverse biased by a tuning voltage (TV) to exhibit a capacitive reactance, the magnitude of which is controlled by the magnitude of the tuning voltage. As noted above, it has been found that a tuned circuit including a varactor diode and a fixed inductor configuration cannot readily be tuned over a relatively large frequency range such as that including bands 1, 2 and 3. Accordingly, the inductor configurations in the tuned circuits of first RF stage 5 and local oscillator 13 are switched in response to band selection signals B1, B2 and B3.

The tuning system shown in FIG. 1 also includes a control section, generally indicated as 29, for generating the band selection signals B1, B2, B3, B4 and B5 and the tuning voltage TV in accordance with the selected channel. Tuner control section 29 comprises a phase locked loop (PLL) including a first frequency divider ($\div K$) 31 and a second frequency divider ($\div N$) 33 coupled in cascade to divide the frequency, $f_{LO}$, of local oscillator signal generated by the selected local oscillator by a factor KN to produce a frequency divided version having a frequency $f_{LO}/KN$. The PLL also includes a crystal oscillator 35 for generating a stable frequency signal and a third frequency divider ($\div R$) 37 for dividing the frequency, $f_{CRYSTAL}$, of the stable frequency signal by a factor R to produce a reference signal having a reference frequency $f_{REF}$, equal to $f_{CRYSTAL}/R$. A phase comparator 39 compares the phase and frequency of the frequency divided version of the local oscillator signal and the reference signal to derive a signal having pulses the polarity and width of which represent the sense and magnitude of any phase and frequency deviation.

In a PLL mode of operation a mode switch 41 applies the pulse signal produced by phase comparator 39 to an integrator 43. Integrator 43 generates the tuning voltage TV and controls its magnitude to reduce the deviation phase and frequency between the frequency divided version of the local oscillator signal and the reference signal. As a result of the PLL mode of operation, the frequency of the local oscillator signal is related to the frequency of the reference signal by the expression:

$$f_{LO}=KN/R \, f_{CRYSTAL}=KNf_{REF} \qquad (1)$$

Frequency divider 33 is a programmable divider which has its division factor, N, set by a control unit 45 in accordance with digital words representing the channel number of the selected channel. The channel number representative digital words are coupled to control unit 45 from a channel selector 47. Channel selector 47 may, e.g., include a calculator like keyboard for entering BCD (binary coded decimal) signals representing the tens and units digits of the selected channel number and a register for storing the BCD signals. Desirably, the values of $f_{CRYSTAL}$, R, and K are selected so that K/R $f_{CRYSTAL}$ is equal to 1 MHz. In that case, the division factor N of frequency divider 37 is equal to the frequency in MHz of the local oscillator signal required to tune the RF carrier for the selected carrier, assuming the RF carrier to have the correct frequency.

The digital words generated by channel selector 47 are also coupled to a band decoder 49. An "air/cable" switch 51 is also coupled to band decoder 49. Switch 51 is to be placed in an "air" position when broadcast channels are to be tuned and in a "cable" position when cable channels are to be tuned. Band decoder generates band selection signals B1, B2, B3, B4 B5 in response to the selected channel number and the position of "air/cable" switch.

It will be noted from the above table that the channel designations for the cable channels are letters rather than numbers. However, the cable channels are also selected by entering tens and units digits as will now be explained. The cable channels are selected by placing air/cable switch 51 in the "cable" position and entering preassigned UHF channel numbers. In that case, control unit 45 sets the division factor N to the value corresponding to the frequency of the local oscillator signal for the cable channel and band decoder 49 generates the one of band selection signals B2, B3 or B4 for activating the appropriate tuning configuration.

The operation of the phase locked loop is initiated when a new channel number is entered. In response, channel selector 47 generates a "change" signal which is coupled to a mode control unit 53. In turn, mode control unit 53, which is coupled to mode switch 41 through a switching duty cycle control unit 55, with which the present invention is particularly concerned as will be described below, causes mode switch 41 to couple the pulse signal produced by phase comparator 39 to integrator 43, thereby completing the phase locked loop configuration and initiating its operation.

To this point it has been assumed that the frequency of the RF carrier has the correct value. However, when the RF carrier is provided by a cable system its frequency may deviate from the correct value. In that case, since the phase locked loop portion of tuning control section 29 operates to tune the frequency of the local oscillator for the correct or nominal frequency of RF carrier for the selected channel, the picture carrier of the IF signal will not be at its nominal value and the receiver will be mistuned. To correct for such frequency deviations an automatic fine tuning (AFT) discriminator 57 coupled to IF section 17 is provided to derive an AFT voltage having a polarity and magnitude representing the sense and magnitude of the deviation between the frequency IF picture carrier and its nominal value.

When the phase locked loop has caused the phase and frequency deviation between the frequency divided local oscillator signal and the reference signal to be so small as to be insignificant, the loop is said to be locked. At this point the pulses produced by phase comparator 39 will have very small widths. When a lock detector 59 detects this occurrence it generates a "lock" signal. The "lock" signal is applied to mode control unit 53 which in turn generates an "AFT enable" signal. The AFT enable signal is coupled to mode switch 41 and a duty cycle control unit 55.

In response to the AFT enable signal mode switch 41 decouples the pulse signal produced by phase comparator 39 from integrator 43 and instead couples the AFT voltage produced by AFT discriminator 53 to integrator 43 with a switching duty cycle determined by switching duty cycle control unit 55 as will be described below. During the following AFT mode of operation the tuning voltage established during the preceeding PLL mode of operation is modified in response to the AFT voltage to change the frequency of the local oscillator signal so as to reduce the deviation between frequency of the IF picture carrier and its nominal value.

Should the frequency deviation of the IF picture carrier exceed the control range of the AFT voltage, typically within ±1 MHz of the nominal frequency value, the frequency of the local oscillator will be offset from the value established during the PLL control mode by a corresponding amount. An offset detector 61 is coupled to programmable divider 33 to detect this occurrence by counting the number of cycles produced by divider 33 during a reference time interval. When the frequency offset exceeds a predetermined offset, offset detector 61 generates an "offset" signal. In response to the offset signal, mode control unit 53 again establishes the PLL control mode and ÷N control unit 45 causes the value of N to be changed by a discrete step value. Thereafter, when the phase locked loop is again locked, the AFT control mode is again established in response to the lock signal. As a result, a channel having an RF carrier with a frequency offset greater than the control range of AFT discriminator 57 may be tuned.

The portions of tuner 1 and tuning control system 29 so far described with the exception of switch duty cycle control unit 55 are known to those skilled in the art and therefore need not be described in further detail. For example, an MST 007 tuner and an MSC 016 tuner control unit employed in commercially available CTC111 color television chassis manufactured by RCA Corporation, Indianapolis, Ind., are suitable for use as tuner 1 and tuner control unit 29, respectively. The MSC 016 control unit is largely incorporated in an integrated circuit commercially available from National Semiconductor Corporation, Santa Clara, Calif. under part number MM58142. The CTC111 chassis is described in "RCA Television Service Data" File 1981 C-3.

Further, a tuner control unit 29 substantially the same as tuner control unit 29, with the exception of switching duty cycle control unit 55, is described in detail in U.S. Pat. No. 4,031,549 issued June 21, 1977 in the name of Rast et al.

Figure 2:
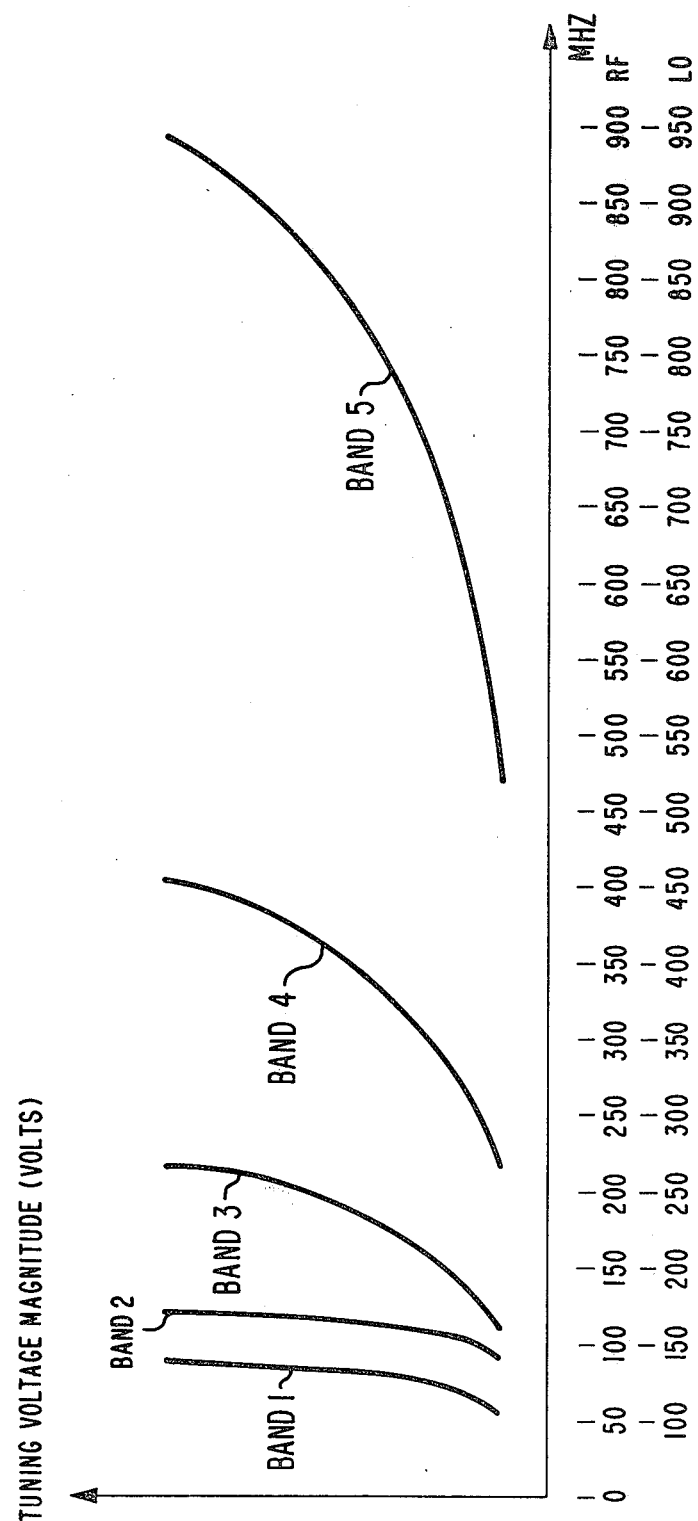
FIG. 2 is a graphical representation of tuning voltage versus frequency characteristics useful in obtaining an understanding of the present invention.

The tuning voltage versus frequency characteristics of the five tuning bands is in terms of both the RF and LO frequencies are shown in FIG. 2. It will be noted that the general slopes of the tuning voltage characteristics of bands 1 and 2 are about the same and that these slopes are greater than that for band 3 and much greater than those for bands 4 and 5. Since at any given frequency the slope of a tuning voltage characteristic represents the tuning voltage change required to produce a given frequency change to a first approximation, the general slope of a tuning voltage characteristic is inversely related to the AFT sensitivity or loop gain for that band. This means that the AFT sensitivities or loop gains for bands 1 and 2 are less than that for band 3 and much less than those for bands 4 and 5. As earlier noted such variation makes it difficult to ensure the stability of the AFT control loop through the entire tuning range.

To compensate for different AFT sensitivities for the various bands, in tuning control system 29 shown in FIG. 1, switching duty cycle control unit 55 is interposed between mode control unit 53 and mode switch 41 to control the switching duty cycle of mode switch 41 and therefore duty cycle of the AFT voltage applied to integrator 41 in accordance with the band of the selected channel. For this purpose switching duty cycle control unit 55 receives pulse signals Q1, Q2, . . . QN from successive stages of a counter 63. Counter 63 produces pulse signals Q1, Q2, . . . QN in response to a clock signal which in the embodiment shown in FIG. 1 is provided by crystal oscillator 35. Although shown separately for the purpose of illustration, divider ($\div$R) 37 and counter 63 may be the same element. Pulse signals Q1–QN are synchronously related in phase but have pulses with successively longer time durations. Switching duty cycle control unit 55 selectively combines pulse signals Q1, Q2, . . . QN to produce a switching control signal for mode switch 41 which has its duty cycle controlled in accordance with the band selection signals B1, B2, B3, B4 and B5 coupled to it. The duty cycle is controlled to be inversely related to the AFT loop gain or directly related to the slope of the tuning voltage versus frequency characteristic.

From FIG. 2 it is also seen that within each band the slope of each of the tuning voltage versus frequency characteristics is not constant as a function of frequency, tending to be greater for higher channels than for lower channels. If desired or necessary to ensure stability, the slope can be made more constant as a function of frequency within a band by changing the duty cycle of the switching control cycle at a predetermined channel in the band. For this purpose, a channel decoder 65, similar in construction to band decoder 49, which responds to the channel number representative signals generated by channel selector 47 and the position of air/cable switch 51 may be provided to generate channel selection signals C1, C2, C3, C4 and C5 when channels higher in frequency than predetermined frequencies in bands 1, 2, 3, 4 and 5, respectively, at which it is desired to change the switching duty cycle of mode switch 41 are selected. The channel selection signals are coupled to switching duty cycle control unit 55 to cause the desired change. If desired or necessary, more than one change in the switching duty cycle per band may be produced in the same manner.

Implementations of portions of tuning control system 29 will now be described with reference to FIGS. 3 and 4. In those FIGURES, elements corresponding to elements shown in previously described FIGURES have the same reference numbers.

Figure 3:
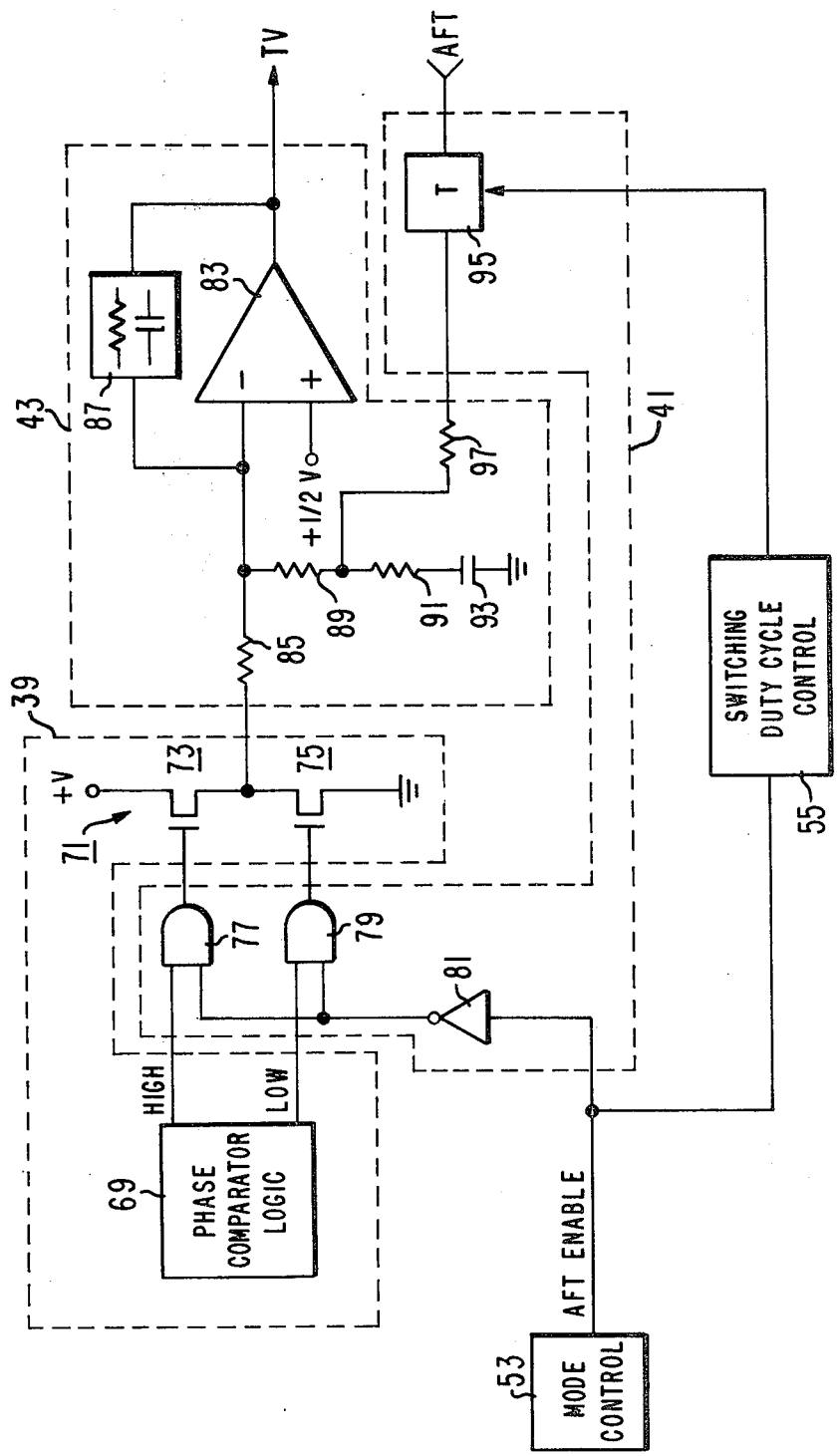
FIG. 3 is a schematic diagram of an implementation of a portion of the preferred embodiment of the present invention shown in FIG. 1.

FIG. 3 includes a schematic diagram of pulse comparator 39, mode switch 41 and integrator 43. Phase comparator 39 includes phase comparator logic 69 for producing a "high" signal including positive going pulses the width of whicH represents the magnitude of positive phase and frequency errors and a "low" signal including positive-going pulses the width which represents the magnitude of negative phase and frequency errors. The phase comparator logic employed in the CD4046 integrated circuit commercially available from RCA Corporation, Somerville, N.J. is suitable for use as phase comparator logic 69. Phase comparator 39 also includes a tri-state logic gate 71 including MOS field-effect transistors (FETs) 73 and 75 with N type conduction channels. The conduction channels of FETs 73 and 75 are connected in series between a source of positive supply voltage V and signal ground. The high and low signals produced by phase comparator logic 69 are coupled to the gate electrodes of FETs 73 and 75 through "and" gates 77 and 79, respectively. The output of phase comparator 39 is developed at the junction of the channels of FETS 73 and 75.

"And" gates 77 and 79 are part of mode switch 41. The AFT enable signal is coupled to inputs of "and" gates 77 and 79 by a logic inverter 81. During the PLL control mode the AFT enable signal has a low level. Accordingly, inverter 81 produces a high level at its output which enables "and" gates 77 and 79 to apply the high and low signals to the gate electrodes of FETS 73 and 75, respectively. When the high signal has a high level, normal non-conductive FET 73 is rendered conductive and a voltage near supply V is developed at the output of phase comparator 39. When the low signal has a high level, normally non-conductive FET 75 is rendered conductive and a voltage near ground potential is developed at the output of phase comparator 39. During the AFT control mode, the AFT enable signal has a high level. Accordingly, inverter 81 produces a low level at its output which causes "and" gates 77 and 79 to apply low levels to the gate electrodes of FETs 73 and 75. In this condition FETs 73 and 75 are both non-conductive thereby effectively decoupling the output of phase comparator 89 from integrator 43.

As shown in FIG. 3, integrator 43 includes an operational amplifier 83 having an inverting ($-$) input, a non-inverting ($+$) input and an output. A reference voltage equal to $+\frac{1}{2}V$ is coupled to the non-inverting ($+$) input. The output signal of phase comparator 39 developed at the junction point between the conduction channels of FETs 73 and 75 is coupled through a resistor 85 to the inverting ($-$) input. A feedback network 87 comprising resistors and capacitors is connected between the output and the inverting ($-$) input. The series combination of a resistor 89, a resistor 91 and a capacitor 93 is connected between the inverting ($-$) input and signal ground. The resistors and capacitors of feedback network 87 and resistors 89 and 91 and capacitor 93 determine the filtering characteristics of integrator 43. The AFT voltage is coupled through transmission gate 95, which is part of mode switch 41, and a resistor 97 to the junction of resistor 89 and 91 of integrator 43. Transmission gate 95 is normally non-conductive and selectively rendered conductive to apply the AFT voltage to integrator 43 in response to the switching control signal generated by switching duty cycle control unit 55.

The implementation of switching duty cycle control unit 55, by way of example, is arranged for the tuning voltage versus frequency characteristics encountered in RCA CTC-111 type television receivers. Thus, before describing the implementation shown in FIG. 4, measured tuning voltage versus frequency characteristics for the five bands tuned by CTC-111 are discussed.

The minimum, maximum and average changes in tuning voltage needed to produce a 6 MHz change in frequency in each band measured in a RCA CTC-111 television receiver are indicated in the following table.

| Band | Minimum $\Delta V$ | Maximum $\Delta V$ | Average $\Delta V$ |
|---|---|---|---|
| 1 | 1.9 | 4.9 | 3.4 |
| 2 | 1.3 | 4.7 | 3.0 |
| 3 | 0.7 | 3.0 | 1.85 |
| 4 | 0.2 | 1.7 | .95 |
| 5 | 0.2 | 0.5 | .35 |

From the above table it is seen that the worst change in slope is between band 1 and bands 4 and 5. Specifically, between the maximum slope in band 1 and the minimum slope in bands 4 and 5 there is a ratio of 4.9/0.2 or approximately 25 to 1 change. It will be noted that by comparing the average of the maximum and minimum slopes, the average slopes in bands 1 and 2 are about equal, and to a rough approximation in terms of multiples of two, about two times the average slope of band 3, about four times the average slope of band 4 and about 8 times the average slope of band 5. The recognition that the average slopes are related by powers of two leads to the relatively simple logic implementation of switching duty cycle control unit shown in FIG. 4.

Figure 4:
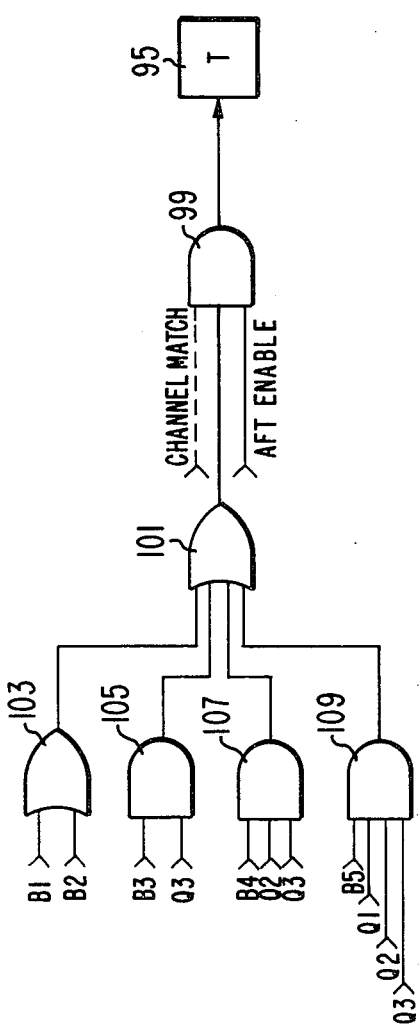
FIG. 4 is a logic diagram of an implementation of another portion of the preferred embodiment of the present invention shown in FIG. 1.
Figure 5:
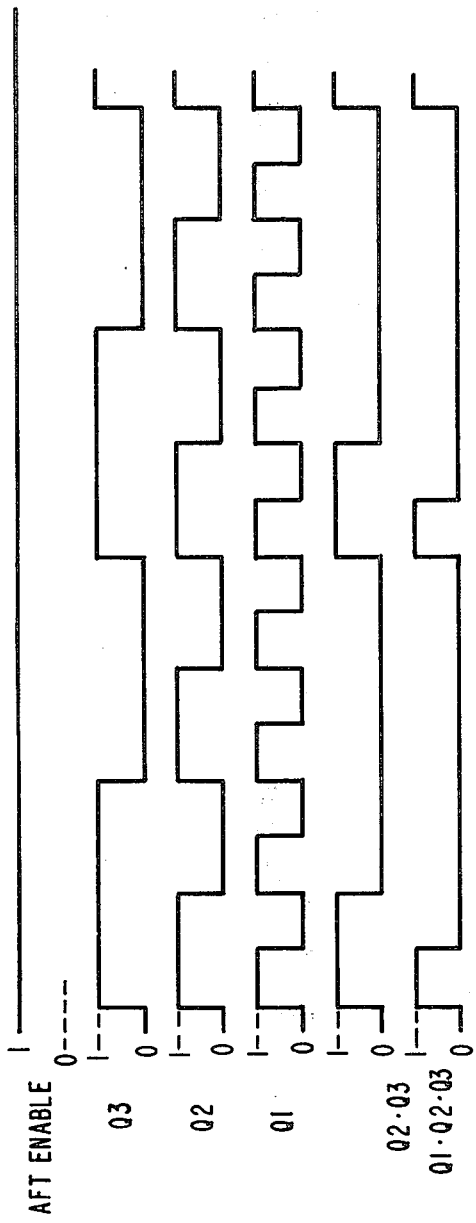
FIG. 5 is a graphical representation of waveforms useful in understanding the implementation shown in FIG. 4.

The description of the implementation switching duty cycle control unit 55 shown in FIG. 4 will be facilitated by concurrent reference to the waveforms shown in FIG. 5. These waveforms represent pulse signals Q1, Q2 and Q3 generated at successive stages of a binary counter comprising counter 63.

The logic implementation of switching duty cycle control unit 55 includes an "and" gate 99 which produces the switching control signal at its output and receives the AFT enable signal at one of its inputs and the output signal of an "or" gate 101 at its other input. "Or" gate 101 receives input signals from an "or" gate 103 and from "and" gates 105, 107 and 109. The input signals of "or" gate 101 have relative duty cycles selected in accordance with the band of the selected channel.

"Or" gate 103 produces a high logic level when either of band selection signals B1 or B1 is high. This causes "or" gate 101 to couple a high level to "and" gate 99. When the AFT enable signal is high, "and" gate 99 causes transmission gate 95 to be conductive. As a result, if the selected channel is in the band 1 or band 2, the AFT voltage is continuously applied as long as the AFT enable signal is at the high level.

When band selection signal B3 is high, "and" gate 105 passes pulse signal Q3 to "or" gate 101. Thus, for band 3, when the AFT enable signal is high, the pulse signal Q3 is coupled to transmission gate 95. Transmission gate 95 is rendered conductive whenever Q3 is at the high level. Since Q3 has a 50% duty cycle, the AFT voltage is converted to a signal with pulses having the same magnitude as the AFT voltage but with only a 50% duty cycle. In effect, this is the same as increasing the charging time constant by integrator 43 by a factor of two. As a result the AFT loop gain for band 3 is effectively reduced by a factor of two with respect to the AFT loop gain for bands 1 and 2.

When band selection signal B4 is high, "and" gate 107 combines pulse signals Q2 and Q3 to produce a pulse signal, indicated as waveform Q2●Q3 in FIG. 5 having a 25% duty cycle. Thus, for band 4, when the AFT enable signal is high, the pulse signal Q2●Q3 is coupled to transmission gate 95. As a result, the AFT loop gain for band 4 is effectively reduced by a factor of four with respect to that for bands 1 and 2.

When band selection signal B5 is high, "and" gate 109 combines pulse signals Q1, Q2 and Q3 to produce a pulse signal, indicated as waveform Q1●Q2●Q3 in FIG. 5, having a 12.5% duty cycle. Thus, for band 5, when the AFT enable signal is high, the pulse signal Q1●Q2●Q3 is coupled to transmission gate 95. Thus, the AFT loop gain for band 5 is reduced by a factor of eight with respect to that for bands 1 and 2.

Since the AFT voltage applied to integrator 43 is a pulse signal having the same frequency as Q3, the frequency of Q3 should be selected, e.g., by selecting the appropriate stage of counter 63, so that integrator 43 can remove the high frequency switching components present in the AFT voltage applied to it.

Thus, the approximate uncompensated AFT loop gain ratios for bands 1, 2, 3, 4 and 5 of 1:1:2:4:8 are compensated by making the switching duty cycles for these bands 100%, 100%, 50%, 25% and 12.5%, respectively. As noted above, such duty cycle selection is chosen on the bases of comparing the average slopes of the tuning voltage characteristics for the bands and does not consider the particular non-linearity of each characteristic.

Figure 6:
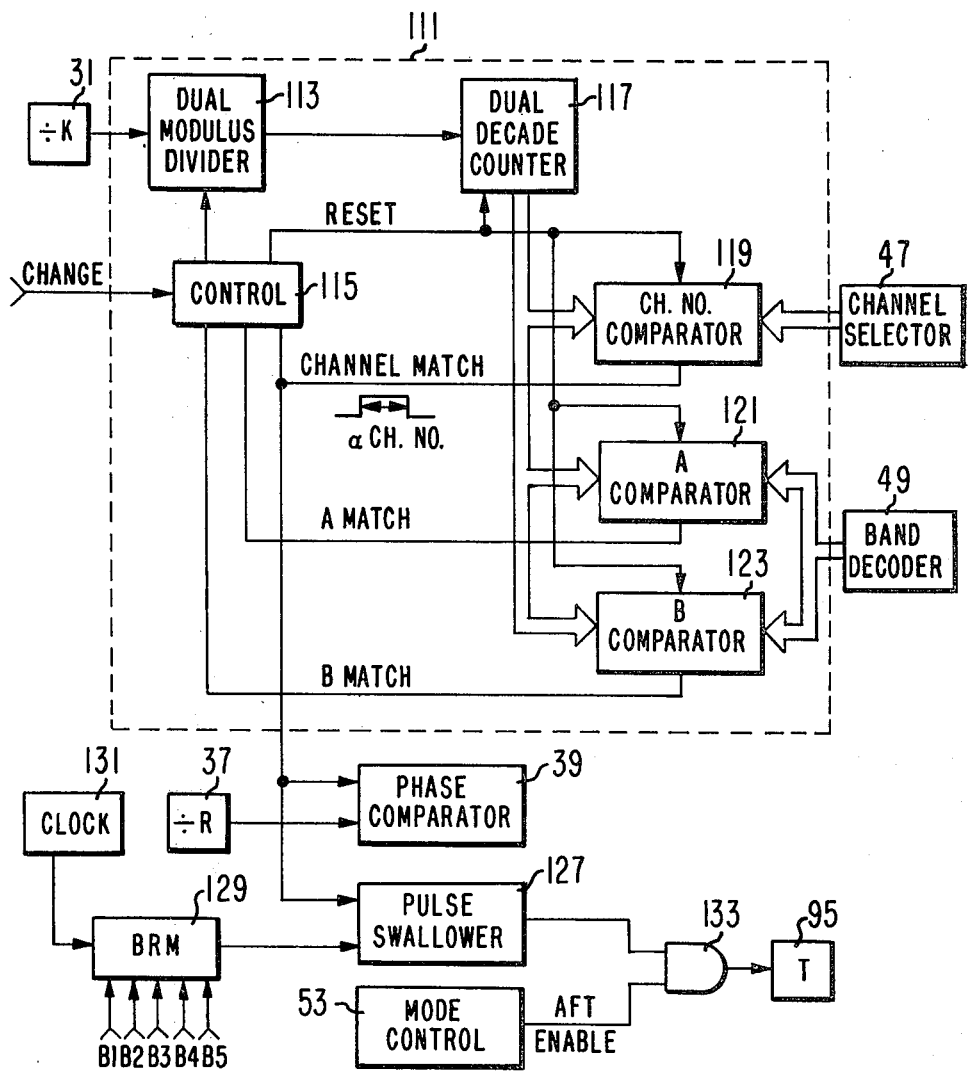
FIG. 6 is a block diagram of an alternative embodiment of the present invention.

One arrangement, including channel decoder 65, for compensating for the non-linearity of the AFT gain characteristics within each band as well as for variations of the AFT gain characteristic between the bands was explained with reference to FIG. 1. FIG. 6 shows another arrangement for such purpose which takes advantage of the fact that programmable divider ($\div$N) 33 produces a pulse signal including pulses having widths directly related to the frequency of the selected channel.

In FIG. 6 the elements corresponding to those also shown in FIGS. 1 and 3 have the same reference numbers. In the arrangement shown in FIG. 6, the functions of programmable divider ($\div$N) 33 and its control unit 45 are performed by unit 111 in a manner similar to that described in detail in the Rast et al. patent referred to above. Unit 111 is based on the recognition that television channels in each band are separated by a predetermined frequency spacing. As a result, in the United States where channels are separated by 6 MHz, the frequency (N), in MHz, of the local oscillator signal for each channel may be expressed as $$N = 6(\text{channel No.}) + \text{constant determined by the band} \quad (2)$$

Accordingly, a dual modulus divider 113 is included in unit 111 to selectively divide the frequency of the output signal of prescaler 31 by a first factor, e.g., in the United States, 6, until a number of cycles are equal to the channel number, are produced at its output then by the first factor until a number of cycles equal to a number A determined by the band are produced at its output, and finally by a second factor, e.g., 5, until a number of cycles equal to a number B also determined by the band are produced at its output. At this point the following expression is satisfied $$N = 6(\text{Channel No.}) + 6A + 5B \quad (3)$$

where A and B are constants determined by the band.

A control unit 115 controls the division factor of dual modulus divider 133. A dual decade counter 117 is provided to count the number of cycles produced at the output of dual modulus divider 113. In response to a "change" signal generated when a new channel is selected, modulus control unit 115 causes divider 115 to divide by 6 and resets counter 117 as well as comparators 119, 121 and 123.

Channel number comparator 119 determines when the number of cycles counted by counter 117 is equal to the channel number and in response to this occurrence causes its output signal "channel match" to change from its reset level to its set level. In response, control unit 115 again resets dual decade counter 117 but does not change the division factor of dual modulus divider 113.

A comparator 121 determines when the number of cycles counted by counter 117 equals the number A for the band and in response to this occurrence generates an "A match" signal. In response to the "A match" signal control unit 115 again resets counter 117 and causes divider 113 to divide by 5.

A comparator 123 determines when the number of cycles counted by counter 117 equals the number B for the band and in response to this occurrence generates a "B match" signal. In response to the "B match" signal, control unit 115 again causes divider 113 to divide by 6 and resets counter 117 and comparators 119, 121 and 123. At this point the equation (3) above is satisfied and the division cycle is complete. Since the channel match signal is generated once in every ÷N cycle, it is used as the output signal of programmable divider (÷N) 33 and is coupled to phase comparator 39.

Since channel number comparator 119 changes from its set state to its reset state at the beginning of the ÷N cycle and from its reset state to its set state when the number of cycles counted by counter 117 equals the channel number, the channel match signal includes pulses with a width directly related to the channel number. Even though the output signal of phase comparator 39 is decoupled from integrator 43 during the AFT control mode, unit 111 operates in a similar manner during both the AFT and PLL control modes. Accordingly, the channel match pulses may be used to modulate the duty cycle of the switch control signal for mode switch 41 to make the AFT loop gain characteristic more uniform within each band.

In each band the lower frequency channels generally leave lesser tuning voltage versus frequency slopes and therefore greater AFT loop gains than the higher frequency channels. Accordingly, if the channel match pulses are chosen to be positive-going, the AFT loop gain may be made more uniform within each band and also between the various bands by simply coupling the channel match signal to an additional input of "and" gate 99 of the logic arrangement shown in as indicated in FIG. 4 by the conductor shown in phantom. In that case it is only necessary that the frequency of Q1, Q2 and Q3 be greater than that of the channel match signal.

Alternatively, the AFT loop gain may be made more uniform within each band and also between the various bands as shown in the lower half of FIG. 6. In that arrangement the channel match pulses are applied to one input of a pulse swallower 127. The other input of pulse swallower 127 is provided by a binary rate multiplier (BRM) 129. Binary rate multiplier 129 receives clock signals from a source of clock which may comprise crystal oscillator 35 and the band selection signals B1, B2, B3, B4 and B5 from band decoder 49. BRM 129 produces a pulse signal having a number of pulses determined by the band selection voltages. The CD 4089 integrated circuit commercially available from RCA Corporation, Somerville, N.J. includes a BRM suitable for use as BRM 29. Pulse swallower 127, removes or "swallows" a number of channel match pulses dependent on the number of the pulses produced by BRM.

Figure 7:
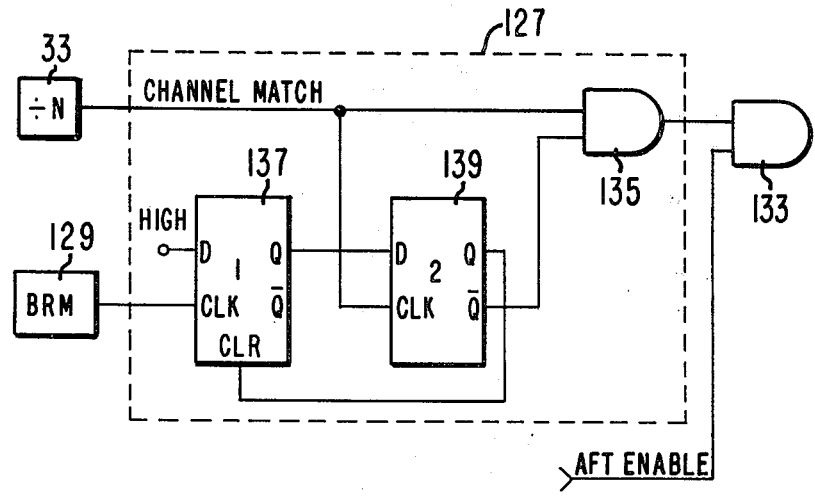
FIG. 7 is a logic diagram of an implementation of a portion of the embodiment of the present invention shown in FIG. 6.
Figure 8:
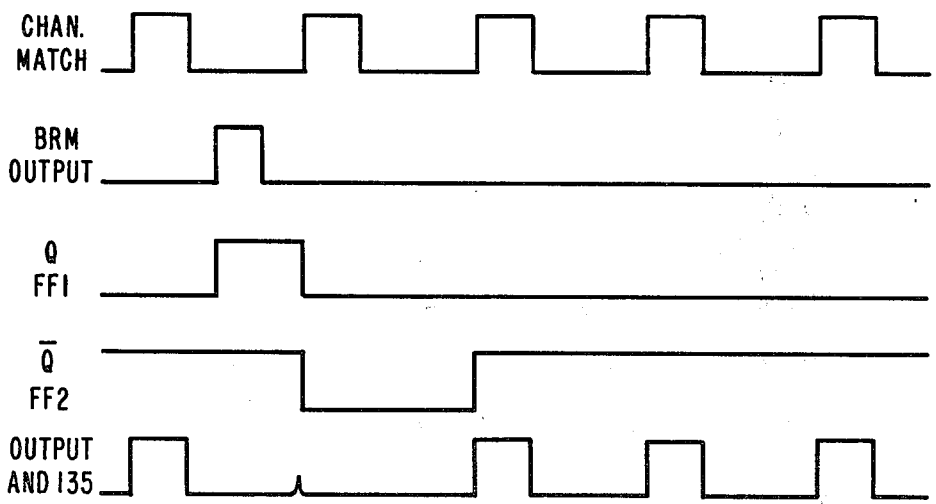
FIG. 8 is a graphical representation of waveforms useful in understanding the implementation shown in FIG. 7.

An implementation of pulse swallower 127 is shown in FIG. 7 in which elements corresponding to those also in previously discussed FIGURES are identified by the same reference numbers. In FIG. 7, pulse swallower 127 simply includes an "and" gate 135 and a pulse synchronizing circuit comprising two data (D) type flip-flops 137 and 139 such as employed in the CD4013 integrated circuit commercially available from RCA Corporation, Somerville, N.J. The pulse synchronizing circuit is used since the pulse produced by BRM 129 may not be synchronized with the channel match pulses. The timing diagram for the implementation shown in FIG. 7 is shown in FIG. 8. The small transient occurring at the positive-going edge of the removed pulse will not adversely affect the operation of the implementation but may be eliminated if desired by the insertion of a delay element such as two inverters in cascade or a small capacitor at the input of "and" gate 135.

Thus, the pulse signal produced by pulse swallower 127 includes a number of pulses (per given time interval) determined by the band of the selected channel, each having a width determined by the channel number of the selected channel. That pulse signal is applied to one input of an "and" gate 133. The other input of "and" gate 133 receives the AFT enable signal. The output of "and" gate 131 is coupled to transmission gate 95. Accordingly, when the AFT enable signal is high, the average level of the AFT voltage applied to integrator 43 is determined by the channel number and band of selected channel.

Since the AFT loop gains for the higher frequency bands are higher than those for the lower frequency bands, the number of channel match pulses removed by pulse swallower 127 should be greater for higher frequency bands than for lower frequency bands. Accordingly, more pulses should be produced by BRM 129 for the higher frequency bands than for the lower frequency bands. Positive-going channel match pulses have the correct polarity to increase the average AFT voltage at high frequency channels within a band to compensate for the decreasing slope of the tuning voltage versus frequency characteristic.

While the present apparatus for making the AFT loop gain more uniform has been explained by way of example with reference to a single conversion tuner for tuning broadcast as well as cable channels, it may be employed with other type of tuners. For example, tuner 1 may comprise a double conversion tuner in which the RF carriers are heterodyned to a first IF signal and the first IF is then heterodyned to a second IF signal having the conventional IF passband characteristic. Such double conversion tuners are believed to be less expensive than single conversion tuners for tuning all the broadcast and cable channels in the television tuning range.

Such a double conversion tuner is described in U.S. patent application Ser. No. 294,133, filed Aug. 19, 1981 in the name of G. E. Theriault. This double conversion tuner tunes over three tuning bands indicated by the following table.

| BAND | RF RANGE (in MHz) |
|------|-------------------|
| 1 | 54–150 |
| 2 | 150–402 |
| 3 | 470–890 |

Since the channels in the bands tuned by a double conversion tuner are more uniformly distributed than the channels in the bands tuned by a single conversion tuner of the type described above, the slopes of tuning voltage characteristics and accordingly the AFT loop gains for the bands tuned by a double conversion tuner are more equal than those for a single conversion tuner. Nevertheless, the present apparatus has been found useful in a double conversion for making the relatively uniform AFT loop gains for the different bands significantly more uniform.

What is claimed is:

1. A tuning system for tuning a receiver to any one of a plurality of channels in a tuning range, comprising:
   means for providing a plurality of RF signals corresponding to respective channels, each of said RF signals including at least one information bearing RF carrier;
   RF means for selecting one of said RF signals in response to a tuning control signal;
   local oscillator means for generating a local oscillator signal and controlling its frequency in response to said tuning control signal;
   mixer means for heterodyning said selected RF signal and said local oscillator signal to produce an IF signal including at least one information bearing IF carrier corresponding to the information bearing RF carrier of the selected RF signal, said IF carrier having a nominal frequency;
   AFT means for producing an analog AFT signal having an amplitude magnitude and polarity representing the magnitude and sense, respectively, of the deviation of the actual frequency of said IF carrier from said nominal frequency;
   channel selection control means for selecting a desired channel including comparison means responsive to said local oscillator signal for generating an error signal representing the deviation between the frequency of said local oscillator signal and a predetermined frequency corresponding to the selected channel;
   conversion means for generating said tuning control signal in response to said error signal;
   switch means for selectively coupling said analog AFT signal to said conversion means in response to a switching control signal coupled to a control input, said conversion means being also responsive to said analog AFT signal to generate said tuning control signal;
   switch control means coupled to said control input of said switch means for generating said switching control signal to control said switch means, said switch control means causing said switch means to be conditioned to couple said analog AFT signal to said conversion means when the deviation between the frequency of said local oscillator signal and said predetermined frequency reaches a predetermined value; and
   duty cycle control means coupled to said switch control means and to said channel selection means for controlling the duty cycle of said switching control signal to determine the switching duty cycle at which said switch means couples said analog AFT signal to said conversion means in accordance with the selected channel.

2. The tuning system recited in claim 1 wherein:
   said tuning range includes a plurality of bands each including some of said channels;
   said RF means includes sections which are selectively activated in response to respective ones of a plurality band selection signals for selecting RF signals in respective ones of said bands in response to said tuning control singal;
   said local oscillator means includes sections which are selectively activated in response to respective ones of said plurality of said band selection signals for generating said local oscillator signal and controlling its frequency in respective ones of said bands in response to said tuning control signal;
   said channel selection control means includes band selection means for generating the appropriate one of said band selection signals in accordance with the channel selected; and
   said duty cycle control means controls the switching duty cycle at which said switch means couples said AFT analog signal to said conversion means in response to said band selection signals.

3. The tuning system recited in claim 2 wherein:
   said duty cycle control means includes a source of clock signals; counter means responsive to said clock signals for producing synchronously phased pulse signals having respective pulses of different widths; and combining means responsive to said pulse signals and said band selection signals for selectively combining ones of said pulse signals in accordance said band selection signals to generate a resultant pulse signal which determines the switching duty cycle at which said analog AFT signal is coupled to said conversion means.

4. The tuning system recited in claim 1 wherein:
   said switch means is interposed between said comparison means, said AFT means and said conversion means; and
   said switch control means causes said switch means to couple said error signal to said conversion means when a new channel is selected and decouple said error signal from said conversion means when the deviation between the frequency of said local oscillator signal and said predetermined frequency for the newly selected channel reaches said predetermined value.

5. The tuning system recited in claim 1 wherein:
   said comparison means includes a source of a reference frequency signal; frequency divider means for dividing the frequency of the local oscillator signal by a predetermined factor corresponding to the selected channel to produce a frequency divided version of said local oscillator signal; and phase comparator means responsive to said reference frequency signal and said frequency divided version of said local oscillator signal for generating as said error signal a pulse signal having pulses the sense and width of which represents the sense and magnitude of the phase and frequency deviations between said reference frequency signal and said divided local oscillator signal; and
   said conversion means includes an integrator.

6. The tuning system recited in claim 4 wherein:
   said frequency divider means produces a pulse signal as said frequency divided local oscillator signal having pulses with a width directly related to the frequency of the selected channel; and
   said switching duty cycle control means is responsive to said band selection signals and said frequency divided version of said local oscillator signal to generate said resultant pulse signal.

7. The tuning system recited in claim 5 wherein:
   said frequency divider produces a pulse signal as said frequency divided local oscillator signal having pulse with a width directly related to the frequency of the selected channel; and
   said duty cycle control means includes pulse removal means responsive to said frequency divided local oscillator signal and said band selection signals for selectively removing pulses of said frequency divided local oscillator signal in accordance with said band selection signals to generate a resultant pulse signal which determines the duty cycle at which said analog AFT signal is coupled to said conversion means.

8. The tuning system recited in claim 7 wherein:

said pulse removal means includes a source of clock signals; binary rate multiplier means responsive to said clock signals and said band selection signals for generating a pulse rate signal having a number of pulses per a given time interval determined in accordance with said band selection signals; and gating means responsive to said frequency divided local oscillator signal and said pulse rate signal for removing pulses of said frequency divided local oscillator signal in said given time interval in response to the pulses of said pulse rate signal.

9. The tuning system recited in claim 1 wherein:

said comparison means includes a source of a reference frequency signal; frequency divider means for dividing the frequency of said local oscillator signal by a predetermined factor corresponding to the selected channel to produce a frequency divided version of said local oscillator signal having a pulse with a width directly related to the frequency of the selected channel; and frequency comparator means for generating said error signal in response to the frequency relationship between said reference frequency and said frequency divided local oscillator signal; and said duty cycle control means is responsive to said frequency divided local oscillator signal to determine the duty cycle at which said analog AFT signal is coupled to said conversion means.

10. The tuning system recited in claim 9 wherein:

said tuning range includes a plurality of bands each including some of said channels;

said RF means includes sections which are selectively activated in response to respective ones of a plurality band selection signals for selecting RF signals in respective ones of said bands in response to said tuning control signal;

said local oscillator means includes sections which are selectively activated in response to respective ones of said plurality of said band selection signals for generating said local oscillator signal and controlling its frequency in respective ones of said bands in response to said tuning control signal;

said channel selection control means includes band selection means for generating the appropriate one of said band selection signals in accordance with the channel selected; and said duty cycle control means is responsive to said band selection signals and said frequency divided local oscillator signal to control the duty cycle at which said analog AFT signal is coupled to said conversion means.

* * * * *

UNITED STATES PATENT AND TRADEMARK OFFICE
CERTIFICATE OF CORRECTION

PATENT NO. : 4,426,734
DATED : January 17, 1984
INVENTOR(S) : Juri Tults et al.

It is certified that error appears in the above-identified patent and that said Letters Patent is hereby corrected as shown below:

Column 9, line 27, "B1 (second occurrence)" should be --B2--.

Column 14, line 7, Claim 2, "AFT analog" should be --analog AFT--.

Signed and Sealed this

Twenty-fourth Day of July 1984

[SEAL]

Attest:

GERALD J. MOSSINGHOFF

Attesting Officer

Commissioner of Patents and Trademarks